US012048355B1

(12) United States Patent
Kaddouri

(10) Patent No.: US 12,048,355 B1
(45) Date of Patent: *Jul. 30, 2024

(54) SYSTEMS FOR DESIGNING AND MAKING CUSTOM FOOTWEAR WITH USER UNDERFOOT COMPONENT

(71) Applicant: LINQ, LLC, Portland, OR (US)

(72) Inventor: Tarik Adam Kaddouri, Portland, OR (US)

(73) Assignee: LINQ, LLC, Portland, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/448,837

(22) Filed: Aug. 11, 2023

Related U.S. Application Data

(62) Division of application No. 17/089,642, filed on Nov. 4, 2020, now Pat. No. 11,758,984.

(51) Int. Cl.
*A43D 1/02* (2006.01)
*A43D 119/00* (2006.01)
*G06F 30/17* (2020.01)

(52) U.S. Cl.
CPC .............. *A43D 1/02* (2013.01); *A43D 119/00* (2013.01); *G06F 30/17* (2020.01); *A43D 2200/10* (2013.01); *A43D 2200/60* (2013.01)

(58) Field of Classification Search
CPC .... A43D 1/02; A43D 119/00; A43D 2200/10; A43D 2200/60; G06F 30/17; G05B 15/02

(Continued)

(56) References Cited

U.S. PATENT DOCUMENTS

| 6,473,667 B1 | 10/2002 | Lee |
| 6,763,611 B1 | 7/2004 | Fusco |

(Continued)

FOREIGN PATENT DOCUMENTS

| CN | 106378929 A | | 2/2017 | |
| CN | 110264304 A | * | 9/2019 | ........... G06K 9/6223 |

(Continued)

OTHER PUBLICATIONS

Nike News, "Nike Football Accelerates Innovation with 3D printed "Concept Cleat" for Shuttle," retrieved from news.nike.com/news/nike-football-accelerates-innovation-with-3d-printed-concept-cleat-for-shuttle, 7 pages, published by Nike, Inc. on Feb. 26, 2014.

(Continued)

*Primary Examiner* — Ronald D Hartman, Jr.
(74) *Attorney, Agent, or Firm* — Kolisch Hartwell, P.C.

(57) ABSTRACT

A custom footwear sole component may have an upper surface conforming to a lower surface of an underfoot component. A method of making the custom sole component includes detecting a shape of a lower surface of the underfoot component. An upper surface of the sole component may be designed that has an upper surface conforming to the detected shape of the lower surface of the underfoot component. The sole-component upper-surface design may conform to three-dimensional geometrical surface data describing an as-worn shape of the lower surface of the underfoot component. Portions of the upper surface of the sole component may extend beyond an upper surface of the underfoot component to form with the underfoot component a combined continuous upper surface. The designed sole component and custom footwear may then be manufactured.

15 Claims, 7 Drawing Sheets

(58) Field of Classification Search
USPC .......................................................... 700/95
See application file for complete search history.

(56) References Cited

U.S. PATENT DOCUMENTS

| | | | |
|---|---|---|---|
| 7,206,718 B2 | 4/2007 | Cavanagh et al. | |
| 7,627,963 B2 | 12/2009 | Kilgore | |
| 7,757,325 B2 | 7/2010 | Cook et al. | |
| D625,492 S | 10/2010 | Teteriatnikov | |
| 8,583,272 B2 | 11/2013 | Spector | |
| 8,918,938 B2 | 12/2014 | Osiol | |
| 9,380,831 B2 | 7/2016 | Craig et al. | |
| 9,572,402 B2 | 2/2017 | Jarvis | |
| 9,648,926 B2 | 5/2017 | Marks | |
| 9,788,600 B2 | 10/2017 | Wawrousek et al. | |
| 10,010,134 B2 | 7/2018 | Guyan | |
| 10,013,711 B2 | 7/2018 | Gooch et al. | |
| 10,104,934 B2 | 10/2018 | Guyan | |
| 10,155,855 B2 | 12/2018 | Farris et al. | |
| 10,231,510 B2 | 3/2019 | Wawrousek et al. | |
| 10,251,446 B2 | 4/2019 | Bischoff et al. | |
| 10,269,174 B2 | 4/2019 | Torvinen et al. | |
| 10,293,565 B1 | 5/2019 | Tran et al. | |
| 10,299,722 B1* | 5/2019 | Tran | B33Y 80/00 |
| 10,452,054 B2 | 10/2019 | McInnis et al. | |
| 10,463,257 B2 | 11/2019 | Schwartz | |
| 10,482,214 B2 | 11/2019 | Cluckers et al. | |
| 10,575,588 B2 | 3/2020 | Perrault et al. | |
| 10,638,927 B1 | 5/2020 | Beard et al. | |
| 10,653,204 B2 | 5/2020 | Homer et al. | |
| 10,874,165 B2* | 12/2020 | Avar | A43B 19/00 |
| 11,758,984 B1 | 9/2023 | Kaddouri | |
| 2001/0032397 A1* | 10/2001 | Ho | A43B 13/12 36/43 |
| 2007/0033750 A1 | 2/2007 | Cook et al. | |
| 2011/0000102 A1* | 1/2011 | Chaw | A43B 7/14 36/43 |
| 2013/0174445 A1 | 7/2013 | Hakkala et al. | |
| 2016/0180440 A1 | 6/2016 | Dibenedetto et al. | |
| 2016/0242502 A1 | 8/2016 | Spanks | |
| 2017/0055629 A1* | 3/2017 | Schickling | A43B 7/1445 |
| 2017/0255185 A1 | 9/2017 | Hinshaw | |
| 2017/0272728 A1 | 9/2017 | Rafii et al. | |
| 2017/0318899 A1* | 11/2017 | Hendrix | A43B 7/08 |
| 2020/0107612 A1* | 4/2020 | Schickling | A43B 7/149 |
| 2020/0107614 A1 | 4/2020 | Walker | |
| 2020/0168004 A1 | 5/2020 | Hung et al. | |
| 2020/0174255 A1 | 6/2020 | Hollands et al. | |

FOREIGN PATENT DOCUMENTS

| | | | |
|---|---|---|---|
| CN | 110264304 A | 9/2019 | |
| DE | 102016205503 A1 | 10/2017 | |
| EP | 1916917 B1 | 5/2008 | |
| EP | 2629641 B1 | 8/2013 | |
| EP | 3228204 B1 | 6/2019 | |
| JP | 2004275611 A * | 10/2004 | |
| JP | 2004275611 A | 10/2004 | |
| JP | 6744677 B1 | 8/2020 | |
| JP | 6744677 B1 * | 8/2020 | A41B 11/007 |
| KR | 100641278 B1 | 11/2006 | |
| KR | 100736813 B1 | 7/2007 | |
| WO | 2009126111 A1 | 10/2009 | |
| WO | WO-2009126111 A1 * | 10/2009 | A43B 17/02 |
| WO | 2010133927 A1 | 11/2010 | |
| WO | WO-2010133927 A1 * | 11/2010 | A61F 5/14 |
| WO | 2017182930 A2 | 10/2017 | |
| WO | WO-2017182930 A2 * | 10/2017 | A43B 13/127 |
| WO | 2018048880 A1 | 3/2018 | |
| WO | 2018097337 A1 | 5/2018 | |
| WO | 2020008101 A1 | 1/2020 | |
| WO | 2020086294 A1 | 4/2020 | |
| WO | WO-2020086294 A1 * | 4/2020 | A43B 1/0054 |

OTHER PUBLICATIONS

Buldt, Andrew K. et al., "Incorrectly Fitted Footwear, Foot Pain and Foot Disorders: a Systematic Search and Narrative Review of the Literature," Journal of Foot and Ankle Research 11:43, 11 pages, published on the Internet Jul. 28, 2018.

HP Development Company, L.P., "Fitstation by hp" webpage, retrieved from www.fitstation.com/ on Nov. 4, 2020, 7 pages, published by HP Development Company, L.P. at least as early as Mar. 14, 2019.

Carbon, Inc., "Carbon Lattice Innovation—the Adidas Story," retrieved from www.carbon3d.com/resources/whitepaper/carbon-lattice-innovation-the-adidas-story/ on Jun. 11, 2020, 5 pages, published by Carbon, Inc. at least as early as Jun. 11, 2020.

\* cited by examiner

SYSTEMS FOR DESIGNING AND MAKING CUSTOM FOOTWEAR WITH USER UNDERFOOT COMPONENT

CROSS-REFERENCES TO PRIORITY APPLICATIONS

This application is a divisional of U.S. patent application Ser. No. 17/089,642, filed Nov. 4, 2020. This priority application is incorporated herein by reference in its entirety for all purposes.

BACKGROUND

This application relates to the field of footwear, and in particular to methods and systems for designing and manufacturing custom footwear incorporating a user underfoot component, such as an orthotic insole.

Traditional footwear is not customized for a user. Rather, the footwear is designed based on general characteristics that apply to most feet, most of the time. As a result, footwear is often not comfortable to users and/or not capable of correcting or preventing problematic foot related conditions.

Standard footwear inserts are designed to correct various common issues related to the foot. Unfortunately, in most cases, the standard footwear inserts do not completely correct a particular user's foot issues. Consequently, custom footwear inserts have been developed in order to compensate for specific issues of an individual user.

However, custom footwear inserts are designed for use in non-custom footwear. The resulting footwear thus still suffers from the limitations of the non-custom portions of the footwear. Accordingly, the effectiveness of custom footwear inserts has been limited.

SUMMARY

The present disclosure provides systems, apparatus, and methods relating to custom footwear incorporating a user underfoot component, such as a custom insole. In some examples, a method of making a custom sole component of a footwear item intended for wearing on a foot of a user includes detecting a shape of a lower surface of an underfoot component having an upper surface intended for use against a sole of the foot of the user when wearing the footwear item. The method includes determining a sole-component design defining an upper surface conforming to the detected shape. The custom sole component is created according to the sole-component design.

In some examples, a custom footwear item includes an underfoot component and a sole component. The underfoot component has an upper surface configured to be worn against a sole of a foot of a user and a lower surface. The sole component has a first upper surface portion conforming to the lower surface of the underfoot component and a second upper surface portion that extends beyond the upper surface of the underfoot component. When the underfoot component is positioned on the first upper surface portion of the sole component, the second upper surface portion adjacent to the upper surface of the underfoot component is aligned with the upper surface of the underfoot component when viewed along a surface line formed where the first upper surface portion meets the second upper surface portion.

In some examples, a system for making a custom sole component of a footwear item intended for wearing on a foot of a user includes a sensor, a storage device, a processor, and a manufacturing apparatus. The sensor assembly is configured to detect a shape of a lower surface of an underfoot component having an upper surface intended for use against a sole of the foot of the user when wearing the footwear item. One or more than one storage device is configured to store data relating to the lower surface of the underfoot component. The processor is coupled to the sensor assembly and the storage device and configured to determine a sole-component design defining an upper surface conforming to the detected shape. The manufacturing apparatus is configured to create the custom sole component having the sole-component design.

Features, functions, and advantages may be achieved independently in various examples of the present disclosure, or may be combined in yet other examples, further details of which can be seen with reference to the following description and drawings.

DETAILED DESCRIPTION

Figure 1:
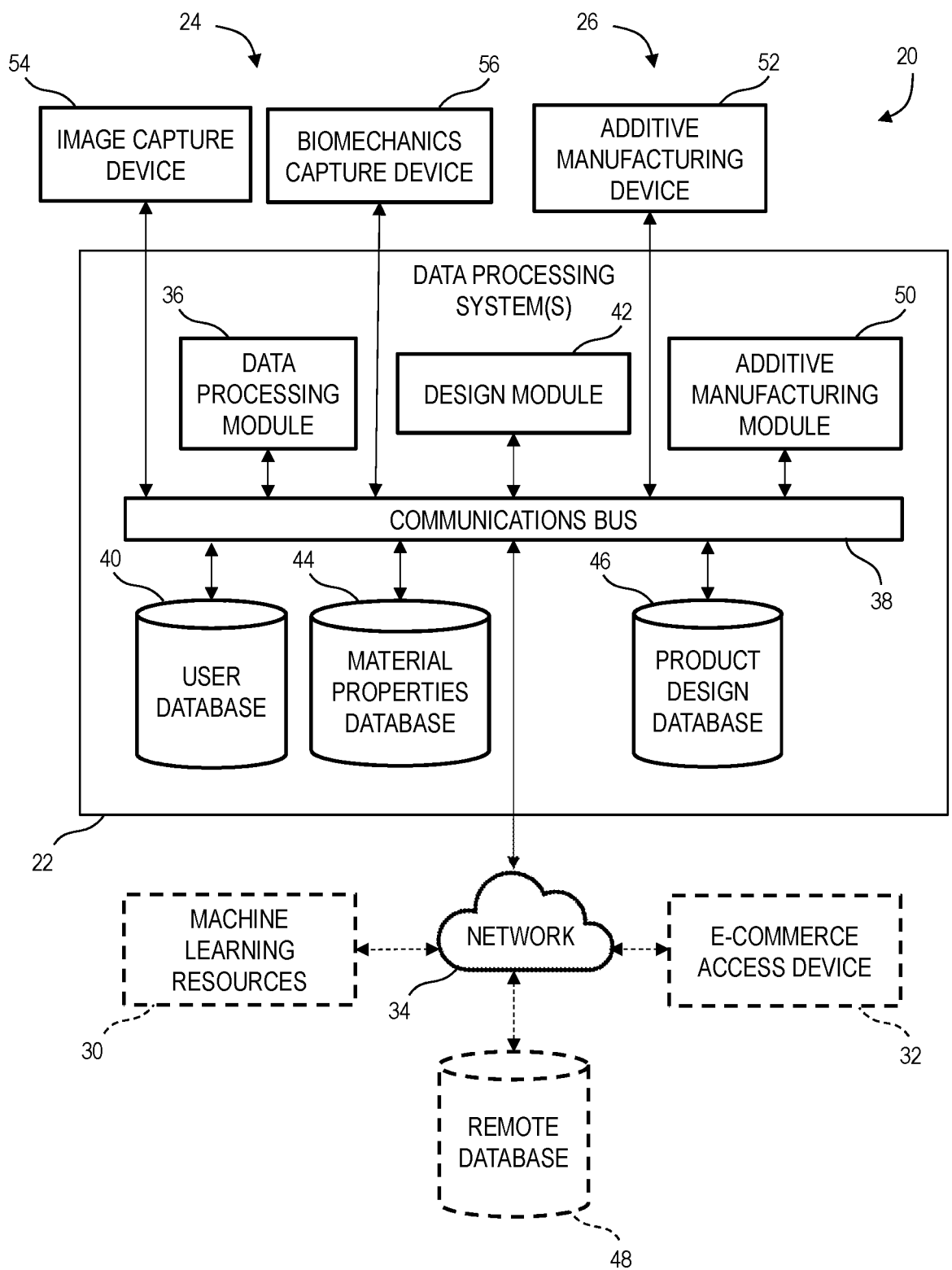
FIG. 1 is a block diagram of an illustrative system for making custom sole components of footwear.

Various aspects and examples of a system for making a sole component of a footwear item for use with a user-provided underfoot component, as well as related methods, are described below and illustrated in the associated drawings. Unless otherwise specified, a system and method for making a custom sole component, and/or its various features may, but are not required to, contain at least one of the structures, components, functionalities, and/or variations described, illustrated, and/or incorporated herein. Furthermore, unless specifically excluded, the process steps, structures, components, functionalities, and/or variations described, illustrated, and/or incorporated herein may be included in other similar devices and methods, including being interchangeable between disclosed examples. The following description of various examples is merely illustrative in nature and is in no way intended to limit the disclosure, its application, or uses. Additionally, the advantages provided by the examples described below are illustrative in nature and not all examples provide the same advantages or the same degree of advantages.

This Detailed Description includes the following sections, which follow immediately below: (1) Overview; (2) Examples, Components, and Alternatives; (3) Illustrative Combinations and Additional Examples; (4) Advantages, Features, and Benefits; and (5) Conclusion. The Examples, Components, and Alternatives section is further divided into subsections A through D, each of which is labeled accordingly.

Overview

In general, a custom footwear sole component may have an upper surface conforming to a lower surface of an underfoot component. An exemplary method of making the custom sole component may include detecting a shape of a lower surface of the underfoot component. An upper surface of the sole component may be designed that has an upper surface conforming to the detected shape of the lower surface of the underfoot component. The designed sole component and custom footwear may then be manufactured.

Aspects of making a custom sole component may be embodied as a computer method, computer system, or computer program product. Accordingly, such aspects may take the form of an entirely hardware example, an entirely software example (including firmware, resident software, micro-code, and the like), or an example combining software and hardware aspects, all of which may generally be referred to herein as a "circuit," "module," or "system." Furthermore, aspects may take the form of a non-volatile computer program product embodied in a computer-readable medium (or media) having computer-readable program code/instructions embodied thereon.

Any combination of computer-readable media may be utilized. Computer-readable media can be a computer-readable signal medium and/or a computer-readable storage medium. A computer-readable storage medium may include an electronic, magnetic, optical, electromagnetic, infrared, and/or semiconductor system, apparatus, or device, or any suitable combination of these.

A computer-readable signal medium may include a propagated data signal with computer-readable program code embodied therein, for example, in baseband or as part of a carrier wave. Such a propagated signal may take any of a variety of forms, including, but not limited to, electromagnetic, optical, and/or any suitable combination thereof. A computer-readable signal medium may include any computer-readable medium that is not a computer-readable storage medium and that is capable of communicating, propagating, or transporting a program for use by or in connection with an instruction execution system, apparatus, or device.

Program code embodied on a computer-readable medium may be transmitted using any appropriate medium, including but not limited to wireless, wireline, optical fiber cable, RF, and/or the like, and/or any suitable combination of these. Computer program code for carrying out operations for aspects of the method may be written in one or any combination of programming languages.

Aspects of the methods and systems for making a custom sole component are described below with reference to flowchart illustrations and/or block diagrams of methods, apparatus, systems, and/or computer program products. Each block and/or combination of blocks in a flowchart and/or block diagram may be implemented by computer program instructions. The computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block(s). In some examples, machine-readable instructions may be programmed onto a programmable logic device, such as a field programmable gate array (FPGA).

These computer program instructions can also be stored in a computer-readable medium that can direct a computer, other programmable data processing apparatus, and/or other device to function in a particular manner, such that the instructions stored in the computer-readable medium produce an article of manufacture including instructions which implement the function/act specified in the flowchart and/or block diagram block(s).

The computer program instructions can also be loaded onto a computer, other programmable data processing apparatus, and/or other device to cause a series of operational steps to be performed on the device to produce a computer-implemented process such that the instructions which execute on the computer or other programmable apparatus provide processes for implementing the functions/acts specified in the flowchart and/or block diagram block(s).

The flowchart and block diagrams in the drawings are intended to illustrate the architecture, functionality, and/or operation of possible implementations of systems, methods, and computer program products for making custom sole components. In this regard, each block may represent a module, segment, or portion of code, which comprises one or more executable instructions for implementing the specified logical function(s). In some implementations, the functions noted in the block may occur out of the order noted in the drawings. For example, two blocks shown in succession may, in fact, be executed substantially concurrently, or the blocks may sometimes be executed in the reverse order, depending upon the functionality involved. Each block and/or combination of blocks may be implemented by special purpose hardware-based systems (or combinations of special purpose hardware and computer instructions) that perform the specified functions or acts.

Examples, Components, and Alternatives

The following sections describe selected aspects of exemplary methods and systems for designing and manufacturing custom footwear incorporating a user underfoot component, as well as related systems and/or methods. The examples in these sections are intended for illustration and should not be interpreted as limiting the entire scope of the present disclosure. Each section may include one or more distinct examples, and/or contextual or related information, function, and/or structure.

A. Illustrative System for Designing and Making Custom Footwear

As shown in FIG. 1, this section describes an illustrative system 20 for designing and making a custom sole component of a footwear item. System 20 is an example of a system for making a custom sole component for use with a separate underfoot component, such as an orthotic insole, commercial insole, ankle brace, or ankle foot orthosis (AFO).

System 20 includes a data processing system 22, a data collection assembly 24, and a footwear manufacturing assembly 26. An example of a data processing system is described in Example D, below. Data processing system 22 may be a single computer, or may include a plurality of computers, computer systems, and/or data processing system elements in data communication.

Data processing system 22 includes a data processing module 36, a design module 42, and an additive manufacturing module 50. Each module may include any suitable combination of hardware and software. For example, each module may comprise instructions or program code executed by a processor. Data processing module 36, design module 42, and manufacturing module 50 may operate on a common shared processor, on separate processors, or a combination of shared and separate processors.

Data processing system 22 further includes a user database 40, a material properties database 44, and a product design database 46. Each database may comprise any combination of hardware and software suitable for temporary or permanent storage and retrieval of data. User database 40, materials properties database 44, and product design database 46 may exist on a common shared storage device, on separate storage devices, or on a combination of shared and separate storage devices. Such storage devices may be resident on a local host computer, as depicted, and/or may be resident on a remote server and available over a network 34 as a remote database 48.

In the depicted example, a communications bus 38 facilitates communication between all elements of system 20. In general, data communication paths between the various elements of system 20 may be direct or indirect, may traverse a single or multiple networks, may include intervening devices, may be wired or wireless, may use different protocols, may use different mediums, etc. Moreover, the data communication paths may be one-way or two-way such that data may be shared between various elements.

Data processing module 36 is communicatively coupled to data collection assembly 24 to receive data associated with a foot of a user and any underfoot component that the user presents for use in the custom footwear. The user data acquired by data processing module 36 may be stored in user database 40 during data accumulation and processing.

In this example, data collection assembly 24 includes an image capture device 54 and a biomechanics capture device 56. The data collection assembly may collect data on a foot or feet of a user, an underfoot component presented by the user, and/or a combination of an underfoot component as worn by the user. The assembly collects static data such as images, dimensional measurements, and/or pressure measurements. In some examples, the assembly may further collect dynamic data such as gait timing, distance, and/or force measurements.

In some examples, data collection assembly 24 may additionally collect information on material properties of a presented underfoot component. In such examples, the assembly may include equipment appropriate to perform American Society for Testing and Materials (ASTM) compliant testing of properties such as density or rebound. Alternatively, data processing module 36 may be configured to receive data on material properties of an underfoot component from an external source, for instance results from testing performed in a laboratory and/or specifications of an orthotic prescription.

Image capture device 54 may capture two-dimensional images, which may be used by data processing module 36 to build a three-dimensional model. For example, a user's smart phone camera may be used to record images or video of the user's feet, and data processing module 36 may include 3D modelling software appropriate to process the recorded images or video into a model of the user's feet. Alternatively, image capture device 54 may include a 3D camera or other device configured to generate three-dimensional data without processing by module 36, such as an optical or laser scanner.

Biomechanics capture device 56 may include a pressure sensitive mat, pad, or plate, pressure sensors in footwear, scales, or any other sensor appropriate to collect data of interest. For capture of dynamic data, a pressure sensitive mat may be configured to measure pressure over time, and may be sufficiently large to allow measurement of user movements such as running, walking, jumping, landing, or pivoting.

Data collection may be performed by an operator using image capture device 54 and biomechanics capture device 56, and/or one or both of the capture devices may be partially or fully automated. In some examples, a user may act as an operator. In other examples, an experienced or qualified operator may perform data collection for a user.

In some examples, data collection assembly 24 may further include a user interface to allow a user to manually input identifying information such as a user ID and/or subjective data such as design preferences, as discussed in greater detail below. Such an interface may include a graphical display and an input device, for instance a monitor and keyboard, or a touchscreen.

Design module 42 accesses the collected data in user database 40, as well as technical information in materials properties database 44, to develop a custom sole-component design. The module may also include user preferences in the design, such as stack height, footwear silhouette, and/or material. In some examples, the design module may further design a full item of footwear including the custom sole component. The developed design is stored in product design database 46.

Design module 42 may include three-dimensional (3-D) modeling software and/or Computer Aided Design (CAD) software such as Rhinoceros 3D, Topology 3D, AutoCAD, SolidWorks, Fusion 360, or Grasshopper. The module may combine data collected on a user's foot and on a user's underfoot component such as an orthotic insole or AFO, to generate a custom sole component conforming to the underfoot component and the user's foot when worn. The module may generate a lattice structure of a sole component, configuring structural properties of the lattice such as node density or strut thickness to achieve appropriate properties of the sole component.

Once the custom sole-component design is complete, additive manufacturing module 50 converts the design into a format usable by an additive manufacturing device 52 of footwear manufacturing assembly 26. In some examples, additive manufacturing module 50 may act as a controller for additive manufacturing device. In other examples, the manufacturing assembly may further include a controller. For instance, manufacturing assembly 26 may receive custom footwear design data in the form of STL format or Polygon File Format (PLY) files, which may be interpreted by a controller in order to drive additive manufacturing device 52. For another instance, the manufacturing assembly may receive instructions from additive manufacturing module 50 appropriate to drive the additive manufacturing device directly.

Manufacturing assembly 26 may also include other devices appropriate to manufacture and/or assembly of footwear components. The manufacturing assembly may be configured to produce a complete item of footwear, and/or to produce a sole component for use in a further manufacturing process performed by another system and/or facility.

In some examples, the elements of system 20 depicted in FIG. 1 may be integrated into a single apparatus. In such embodiments, a user may be able to be scanned (e.g. by image capture device 54) and tested (e.g. by biomechanics capture device 56) and subsequently receive custom footwear or custom footwear portions, such as a body, an insole, a midsole, or an outsole, all in the same place. In such embodiments, an operator may be present to take part in or at least validate the data collection and/or design of the custom footwear. However, in other embodiments, the entire process may be automated. For example, in some embodiments, the entire system 20 may be a kiosk or the like at a footwear store, sporting goods store, or the like.

In other examples, some or all of the elements of system 20 may be separate. For example, data collection assembly 24 may be separate from data processing system 22 and manufacturing assembly 26. For example, a kiosk or the like in a retail location may include a sensor assembly in data communication with a data processing system in a remote server location, and a manufacturing assembly in a factory location. Alternatively, while these various elements may be physically separate in certain embodiments, they may still be co-located at a particular location, such as a footwear store in order that a user could be scanned and provided with custom footwear at the same location.

In some examples, system 20 may further include machine learning resources 30 and/or an e-commerce access device 32. Machine learning resources 30 and e-commerce access device 32 may be directly connected to data processing system 22, or as shown, may be indirectly connected to data processing system 22 via network 34.

E-commerce device 32 may facilitate purchase of custom footwear by a user and/or allow the user to participate in design of an item of custom footwear. Examples of e-commerce devices include, but are not limited to: a tablet, phone, personal computer, or other device owned by a user, and a kiosk or computer accessible in a retail store. In many examples, an internet browser or other software on e-commerce device 32 may allow the user to interface with an e-commerce system such as a web store hosted on a remote server.

Using e-commerce device 32, a user may create a unique user ID associated with a user profile to allow storage and recall of user data captured by data collection assembly 24, designs generated by design module 42, and/or properties of a custom sole component or item of footwear produced by manufacturing assembly 26. The user may also submit orders for footwear and/or input design preferences using e-commerce device 32. For example, the user might select a footwear silhouette such as a sandal, sneaker, or dress shoe, select a stack height, and/or select a color or material. In some examples, such functionalities of e-commerce device 32 may be integrated in data processing system 22, for instance as part of a full-service retail kiosk.

Machine learning resources 30 may be utilized by design module 42 to optimize custom footwear design. For example, a multivariate regression model or models may be used to determine optimal lattice properties for desired midsole responsiveness. For another example, a supervised machine learning model may be trained on data from produced custom designs in user database 40 labeled according to user satisfaction and reviews to predict a comfortable stack height.

B. Illustrative Method

Figure 2:
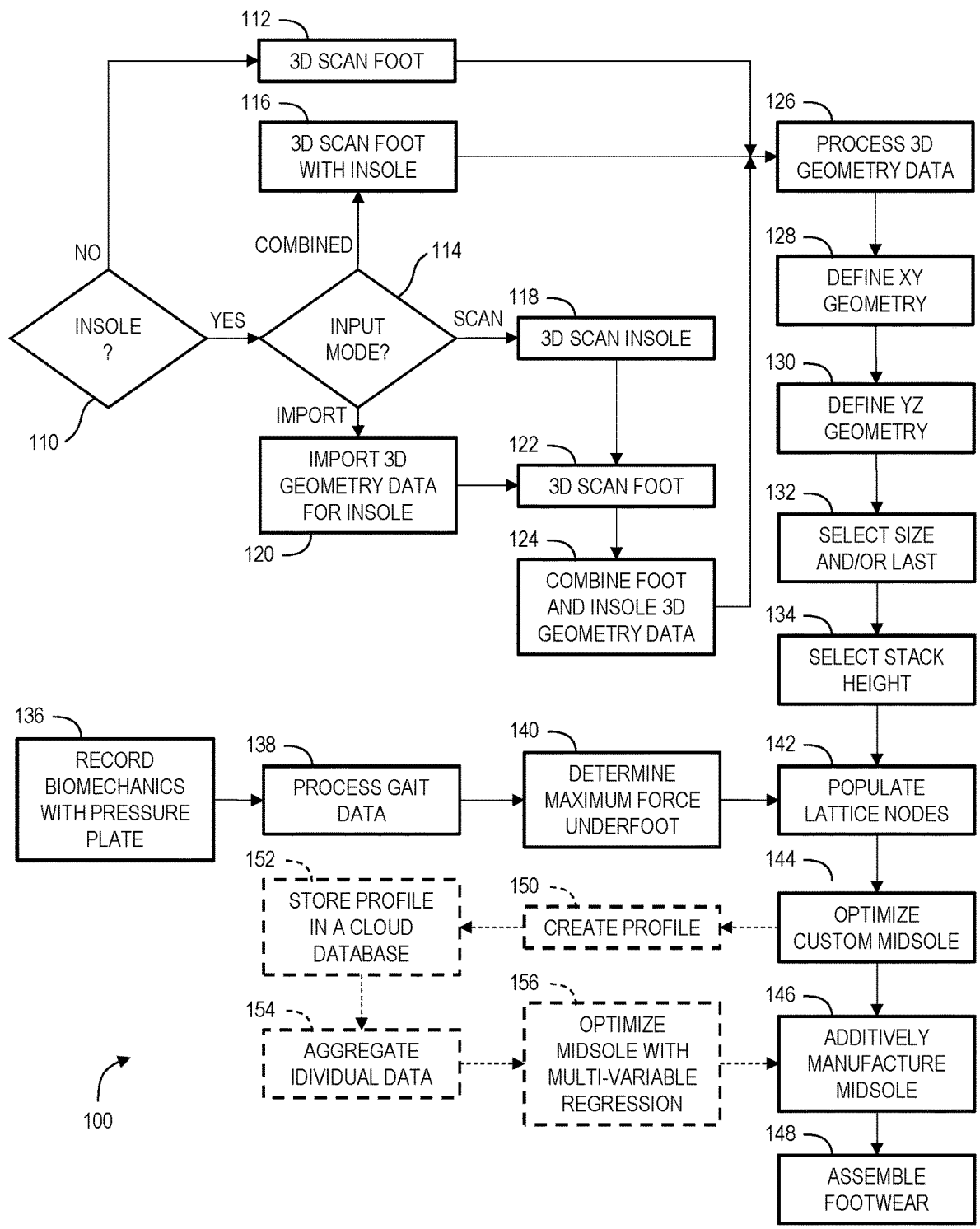
FIG. 2 is a flow chart depicting steps of an illustrative method for making custom sole components of footwear.

This section describes steps of an illustrative method for designing and making custom footwear; see FIG. 2. Aspects of systems and apparatus described above may be utilized in the method steps described below. Where appropriate, reference may be made to components and systems that may be used in carrying out each step. These references are for illustration, and are not intended to limit the possible ways of carrying out any particular step of the method.

FIG. 2 is a flowchart illustrating steps performed in an illustrative method 100, and may not recite the complete process or all steps of the method. Although various steps of method 100 are described below and depicted in FIG. 2, the steps need not necessarily all be performed, and in some cases may be performed simultaneously or in a different order than the order shown. Method 100 is discussed below in reference to a single item of footwear, for one foot of a user. It may be understood that where appropriate, steps may be repeated for each foot of a user in order to produce a pair of footwear. Data and designs for each foot may be maintained separately, such that the pair of footwear includes two distinct custom items of footwear.

Method 100 begins with decision 110, which is directed to whether the custom footwear will be designed for use with an insole. In some examples, another underfoot component intended for use against a sole of the foot of a user may be designed for, such as an orthotic or brace. The decision may be received from a user. That is, the intended wearer of the custom footwear may specify whether the footwear will be used with an insole. If no insole will be used, then the method proceeds with step 112. If an insole will be used, then the method proceeds with decision 114.

Step 112 includes performing a three-dimensional (3D) scan of the user's foot. More specifically, the step may include detecting the size and three-dimensional shape of a lower surface of the user's foot, which may be referred to as the sole of the foot, and producing three-dimensional surface data characterizing the detected size and shape. The surface data may be used to generate at least a partial 3D model of the user's foot.

The scan may be performed using any combination of sensors and data processing effective in producing characteristic surface data. For example, image sensors may be used to capture 2D data which is in turn used build a 3D model. A plurality of images may be taken of the user's foot from different angles, in order to infer depth and 3D structure. Such image sensors may include traditional digital cameras such as those associated with mobile devices (e.g. smartphones and tablets)

In some cases, mobile devices may include stereoscopic image sensors, which may be referred to as "3D cameras." Such devices may have the ability to capture image data and create 3D data or a 3D model without the need for additional processing by an independent processing system. Additionally, more advanced camera systems, such as the "Kinect," available from Microsoft Corporation (Redmond, Wash., USA) provide image data including depth information. Similarly, purpose-built 3D scanners using image sensors, like the "Gotcha" 3Dscanner of 4DDynamics (Antwerp, Belgium) or MakerBot® Digitizer™ (New York, N.Y., USA) may be used.

Other devices may be used to generate 3D data. For example, optical scanners, laser-based scanners, and other scanning systems as are known by persons of skill in the art may be used to scan the user's foot. From step 112, method 100 proceeds with step 126, as described below.

Decision 114 of the method is what mode will be used to input data regarding the selected insole. The decision may be received from a user, as in decision 110, or may be determined by the data collection assembly and/or data processing capabilities of the system used to perform method 100. That is, the system may support only one or two of the modes of input. According to the selected mode, method 100 may proceed with either step 116, 118, or 120, as described below.

Combined input at step 116 includes 3D scanning the user's foot with the selected insole. More specifically, the user may position the selected insole under their foot in an as-worn or use position. Scanning may then be performed as described for step 112, above. The scan may detect the size and three-dimensional shape of a lower surface of the combination of the sole of the user's foot and the selected insole, and produce three-dimensional surface data characterizing the detected size and shape. The surface data may be used to generate at least a partial 3D model of the combination of the user's foot and the as-worn insole.

In some examples, the insole may obscure the entirety of the sole of the user's foot, and the scan may characterize only the bottom of the insole. In some examples, the insole may obscure only a portion of the sole of the user's foot and the scan may characterize a combined surface. From step 112, method 100 proceeds with step 126, as described below.

Scanned input at step 118 includes 3D scanning the selected insole. Scanning may be performed as described for step 112, above. The scan may detect the size and three-dimensional shape of a lower surface of the insole, and produce three-dimensional surface data characterizing the detected size and shape. The surface data may be used to generate at least a partial 3D model of the insole.

In some examples, step 118 may further include evaluating functional properties of the selected insole, in addition to collecting geometric data. For instance, the step may include performing ASTM compliant tests of material properties of the insole such as density or rebound. From step 118, method 100 proceeds with step 122, as described below.

Import input at step 120 includes importing 3D geometry data for the selected insole. Data may be input in any format compatible with a data processing system or systems used to perform steps 124 and/or 126-130. The data may be automatically imported by modeling software, or may be manually input by an operator. For example, a CAD file of a custom insole received from a manufacturer of the insole may be automatically imported by CAD software used in the following steps. For another example, an operator may enter values from a list of measurements or other specifications provided in a doctor's prescription for an orthotic insole or ankle brace.

In some examples, step 120 may further include importing data on functional properties of the selected insole. For instance, the step may include import of results of ASTM compliant tests of material properties of the insole such as density or rebound. For another instance, the step may include importing functional properties of a manufacturer-specified material of the selected insole from a materials properties database. From step 120, method 100 proceeds with step 122.

Step 122 includes performing a 3D scan of the user's foot. The step may be performed in the same manner, to collect the same data as step 112, described above.

Step 124 of method 100 includes combining 3D geometry data on the insole and the user's foot. The insole data used may be obtained either by scanning in step 118, or by importation in step 120. The 3D geometry data may be combined using 3D modeling software to determine a combination lower surface. Details of such combination may depend on the specific software used, and may be known by one skilled in the art of 3D modelling. In some examples, the insole may obscure the entirety of the sole of the user's foot in an as-worn position, and the combination lower surface may include only the 3D geometry data on the insole. In some examples, the combination surface may include the lower surface of the insole and a portion of the sole of the foot of the user that extends beyond the lower surface of the insole in an as-worn position.

In some examples, some or all of the combination may be performed manually. For example, the 3D geometry data may include values for a list of dimensions for each of the insole and the user's foot. Combining the data may then include selecting, for each of the dimensions, the larger of the value for the underfoot component and the value for the user's foot. Such dimensions may include e.g., heel width, ball width, and heel-to-toe length.

Step 126 of the method includes processing the 3D geometry data obtained in step 112, 116, or 124. The processing performed in step 126 may depend on the format of the obtained geometry data. For example, if the data is obtained from a laser scanner, processing may include rendering the data as a 3-dimensional model. For another example, processing the data may include reformatting a data file from a format generated by a 3D modelling or scanning software to a format accepted by a CAD software application.

Preferably, step 126 may at least include cleaning and smoothing the obtained geometry data, and extracting biometric data including but not limited to: heel width, ball width, heel to toe length, arch height, and instep height. The step may further include extracting a perimeter shape and/or one or more underfoot curves.

Step 128 includes using the processed 3D geometry data to define x-y geometry of a midsole of the custom footwear, where x corresponds to length and y corresponds to width. That is, the geometry of an upper surface of the midsole is defined in a horizontal plane, or plane generally parallel to a surface underfoot. More specifically, the step may include using the extracted heel width, ball width, and heel to toe length to define a gauge of the midsole. The defined midsole x-y geometry may be configured to correspond to a perimeter size and shape of a lower surface of a combination of the user's foot and any selected insole.

Step 130 includes using the processed 3D geometry data to define y-z geometry of the custom midsole, where z corresponds to height. That is, the geometry of the upper surface of the midsole is defined in one or more vertical planes, or planes generally perpendicular to the horizontal plane of step 128 and normal to the x-axis. More specifically, the step may include using the extracted arch height and instep height to define depth of the midsole. The extracted heights may be used along with extracted surface data such as underfoot curves to define contours of the upper surface of the midsole.

The defined midsole geometry and/or upper surface contours may be configured to conform to a lower surface of a combination of the user's foot and any selected insole. The upper surface contours may also be described as complementary to the lower surface of the user's foot and as-worn insole.

Steps 126, 128, and 130 may be performed sequentially, as shown or in another order, and/or may be performed simultaneously. Data may be partially processed in step 126, for step 128 and then step 126 may be repeated for additional data for use in step 130. Each of steps 126, 128, 130 may be performed by an operator of a data processing system, may be performed automatically by the data processing system according to an algorithm, and/or any appropriate combination thereof.

Step 132 includes selecting a size and/or last for the custom footwear. In some examples, the step may include receiving a selection from the user. The last selected may be fully custom, in which case a size may not be selected. The last may alternatively be selected from a plurality of pre-defined standard or stock lasts, in which case a size may be determined according to the defined x-y geometry of the custom midsole. A last may be selected for any desired footwear silhouette, including but not limited to sandals, running shoes, hiking boots, dress shoes, and heels.

Step 134 includes selecting a stack height for the custom footwear. In some examples, the step may include receiving a selection from the user. The stack height selection may be between a set of pre-defined stack height ranges and/or or general height categories. For instance, a stack height of short, medium or tall may be selected, which may correspond to one of three pre-determined midsole thicknesses. Such stack height choices may also be referred to as barefoot, minimally cushioned, and highly cushioned. In some examples, the stack height may be selected based on responses from the user to related questions such as intended use of the custom footwear, cushioning preferences, and current footwear.

Steps 136-140 of method 100 may be performed prior to proceeding from step 134 to step 142. In some examples steps 136-140 may be performed prior to decision 110. Preferably steps 134 and 140 may both be completed before step 142 is performed.

Step 136 includes recording biomechanics of the user with a pressure plate. The user may stand on the plate for collection of static pressure data and/or may walk or run on the plate for collection of dynamic pressure data. In the latter case, the user may complete a minimum of 2 full strides. Underfoot pressure output may be collected by the pressure plate and processed in step 138. The step may include processing gait data, and collected pressure data uniquely for left and right feet.

Step 140 includes determining a maximum force underfoot. An aggregate pressure score may be calculated, and maximum pressure underfoot determined in condensed regional areas at the heel and forefoot. The maximum pressure may be calculated according to an ASTM testing standard, in a region of no less than a predetermined amount, such as 55 millimeters (2.2 inches) in diameter.

Step 142 includes populating lattice nodes of the custom midsole. The midsole may partially or wholly comprise a regular or irregular lattice structure. The lattice may include a plurality of open cells defined by beams or struts that meet at nodes. Material properties of the lattice structure, and therefore of the custom midsole, may be affected by node position, density, and size as well as beam position, orientation, thickness, length, and material.

Populating lattice nodes may include selecting a number of nodes appropriate to achieve a desired material property of the custom midsole. Populating lattice nodes may be based in part on the volume of the midsole as defined in steps 128 and 134 and/or the biomechanical data obtained in steps 136-140. For example, if a user is recorded as weighing 200 pounds with a maximum underfoot force of approximately 10 Newtons and a size 12 shoe is selected, approximately 500 nodes may be populated. And, if another user is recorded as weighing 120 pounds with a maximum underfoot force of approximately 6 Newtons and a size 7 shoe of the same stack height is selected, approximately 350 nodes may be populated.

Populating lattice nodes may also include positioning the selected number of nodes according to the midsole geometry defined in steps 128-134. The nodes may be evenly distributed, or may vary in density. The nodes may be populated automatically by design software, according to selected factors, such as the recorded biomechanical data, determined midsole geometry, and desired material properties. An operator of the software may supervise and/or modify the automatic node population as appropriate. In some examples, an operator or footwear designer may specify a number of nodes to populate.

Step 144 includes optimizing the custom midsole. Design software may be used to determine lattice properties appropriate to achieve desired material properties of the custom midsole. For example, node size and/or beam thickness may be selected to achieve a desired responsiveness value under ASTM compliant testing. Data on material properties of a selected manufacturing material may also be used in the optimization. In some examples, machine learning may be utilized in the optimization process as described further with reference to step 156, below.

Optimizing the custom midsole may include receiving values for parameters such as rebound or shock attenuation, and in some instances receiving tolerances within which the corresponding parameters of the midsole are to be optimized. Additionally or alternatively, optimizing the custom midsole may include determining values for parameters such as rebound or shock attenuation based on the biomechanical data obtained in steps 136-140. For example, higher rebound may be appropriate for higher maximum underfoot forces. Determination of such values may be performed by a designer and/or automatically by design software.

Step 146 includes additively manufacturing the custom midsole. The optimized midsole design may be prepared for manufacture into a complete item of footwear with the addition of remaining footwear elements such as an outsole and/or an upper. For example, an outsole design may be added which incorporates regional notches or cavities on the sides and underneath for assembly of an upper. The location of such notches and/or design of the upper may be determined by proportions between biometric values obtained in steps 126-130.

The design of the midsole and any other elements of the footwear to be additively manufactured may be exported from the design software into a format appropriate for additive manufacture. For example, a CAD file may be exported in STL format, and then converted by additive manufacturing software for use by the controller of an additive manufacturing device.

The midsole may be additively manufactured by any appropriate method. Examples include, but are not limited to: Stereolithography (SLA), Selective Laser Sintering (SLS), Selective Laser Melting (SLM) and Fused Deposition Modeling (FDM). The midsole may be manufactured of various materials, such as: polypropylene, thermoplastic polyurethane, polyurethane, acrylonitrile butadiene styrene (ABS), polycarbonate (PC), PC-ABS, PLA, polystyrene, lignin, polyamide, polyamide with additives such as glass or metal particles, methyl methacrylate-acrylonitrilebutadiene-styrene copolymer, resorbable materials such as polymer-ceramic composites, among others. In some examples, commercially available materials may be utilized.

Step 148 of method 100 includes assembling the custom midsole into the item of footwear. Assembly may include attaching the additively manufactured midsole to an outsole, an upper, and/or any element of the footwear not additively manufactured as an integral structure with the midsole. Assembled components may include materials such as synthetic fibers, leather, and/or knitted fabric. Assembly may be performed according to methods know to those skilled in the art of footwear manufacture.

Optionally, method 100 may further include steps 150, 152, 154, and/or 156. Some or all of the optional steps may be performed. Step 150 includes creating a profile for the user. The profile may be associated with and/or include user data such as collected 3D geometry and biomechanics data, a custom midsole design, or user selections, e.g. The user profile may be automatically generated or requested by the user.

Step 152 includes storing the created profile in a cloud database. That is, the profile and user data may be stored on a server accessible over the internet. For example, the user profile and data may be stored in the database of an e-commerce website or online store, via a user device such as a personal computer or smartphone. For another example, the user profile and data may be stored in a dedicated database accessible by e-commerce applications or software via a cloud service application programming interface (API).

The user may retrieve stored data for additional purchases, and/or a footwear manufacturing or retail service may access the data for manufacture or sale of additional footwear. For example, a user or retailer may retrieve the user's data via the profile to allow the user to purchase an additional pair of footwear, without need to repeat steps 110-130 and 136-140.

Step 154 includes aggregating individual user data. Data from some or all of created user profiles may be extracted and aggregated for analysis. Aggregate data may be analyzed to allow improved footwear design, user recommendations, and/or for any relevant purpose.

Step 156 includes optimizing midsole design with multivariable regression. One or more machine learning multivariate regression models may be trained on the data aggregated in step 154, and used in optimization of step 144. Machine learning may be performed by the data processing system performing the design optimization of step 144 and/or may be performed by a remote processor accessed over a network such as an online artificial intelligence (AI) resource service.

C. Illustrative Custom Footwear

As shown in FIGS. 3-11, this section describes multiple illustrative items of custom footwear. Each described item of footwear is or includes an example of a custom footwear sole component, as described above. Custom footwear (such as a shoe) may comprise several individual footwear portions, such as, for example: an upper, a midsole, and an outsole. The custom footwear may be designed for use with an underfoot component.

The upper of an item of custom footwear may be the portion of the footwear that surrounds the sides and top of a user's foot. The upper may also be referred to as a body of the footwear. The upper may comprise portions, such as a heel support, ankle support, webbing, laces, straps, tongue, and other structures as are known in the art. In some cases the upper may comprise two or more portions that are selectively bound by a user using, for example, laces or straps.

An underfoot component may be positioned inside the footwear, and directly contact some or all of the bottom (and to some extent side) of a user's foot. In some instances, the underfoot component may be part of a larger medical device such as a limb brace or other orthosis. Examples of underfoot components include but are not limited to a standard size-based orthopedic insole, a custom orthotic insole, an AFO, or a prescribed orthotic ankle brace. An underfoot component may be separable and removable from the footwear.

A midsole may be a footwear portion between the underfoot component and the outsole, which, in some instances, is primarily a shock-absorbing portion. In some instances, the midsole may be designed to be primarily responsible for supporting a substantial portion of the weight of a user as well as providing shock absorbing properties for the footwear while in use. In some instances, the midsole may be designed to enhance the effectiveness of features found in the underfoot component and/or outsole.

The outsole may be the outer-most portion of footwear, and may be designed to interface with the ground or other external support surface. In some instances, the outsole is alternatively known as a tread. The outsole may be designed with, for example, structures and/or textures for providing grip to the footwear on a variety of surfaces. Additionally, the outsole may be designed to protect a user's foot from puncture or other harmful intrusion. In some examples, the outsole may be integral with the midsole and/or the midsole may be configured to perform the functions of the outsole.

An item of custom footwear may include one or more of the aforementioned portions. Different combinations of these footwear portions are envisioned for footwear.

Figure 3:
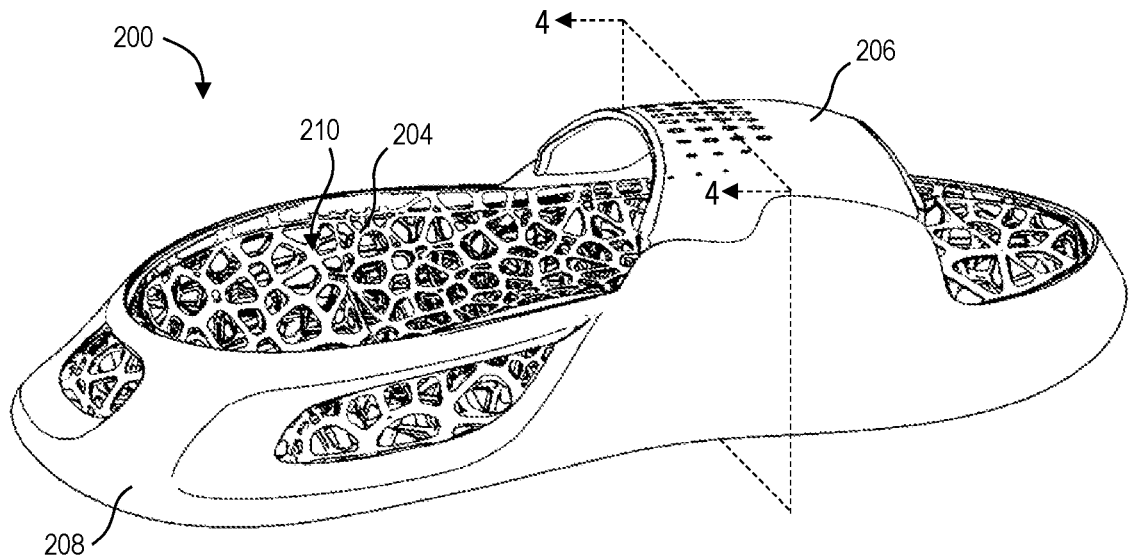
FIG. 3 is an isometric view of an illustrative footwear item that may be made by the system of FIG. 1 and/or the method of FIG. 2.
Figure 4:
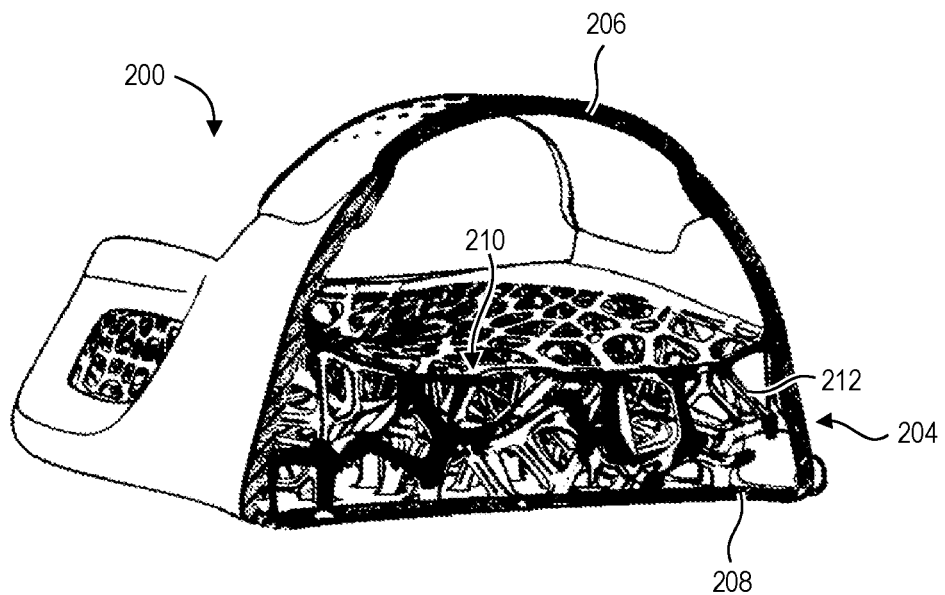
FIG. 4 is an isometric view of a heel end of the footwear item of FIG. 3 showing a section view taken along line 4-4 in FIG. 3.
Figure 5:
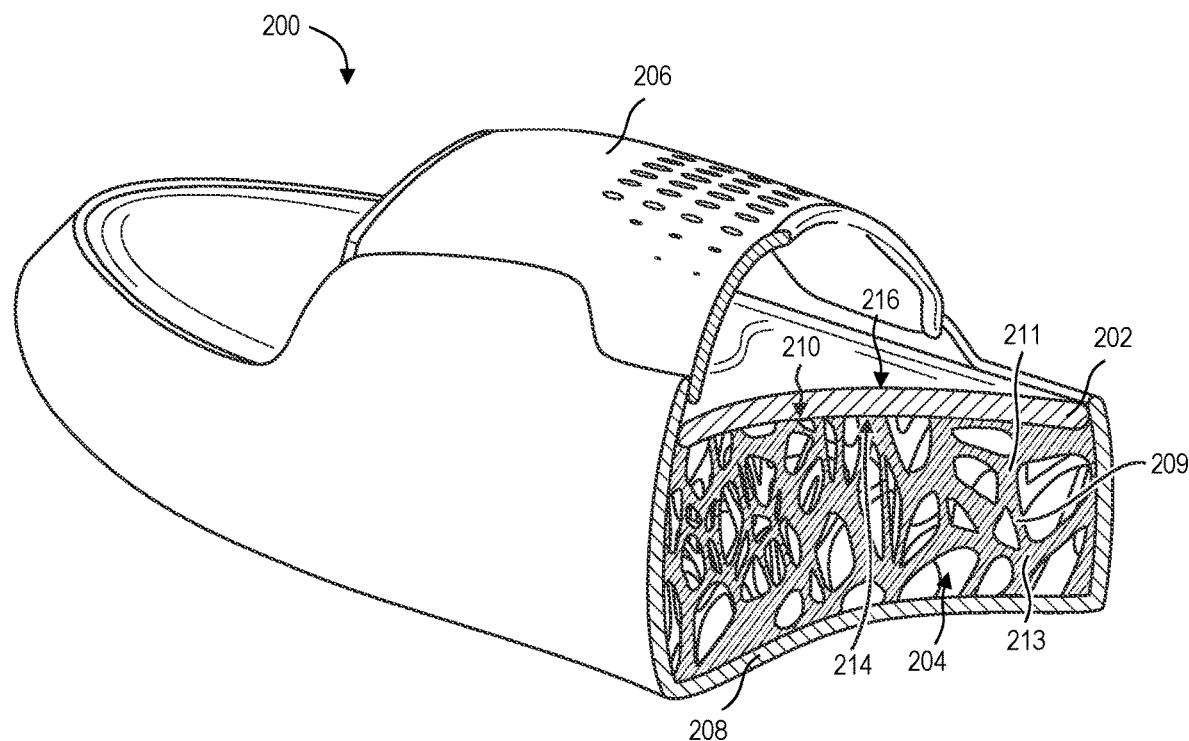
FIG. 5 is an isometric view of the footwear item of FIG. 3 with a user-provided insole and showing the heel end cut away.

FIGS. 3-5 depict an illustrative custom footwear item in the form of a sandal 200 designed to be worn with a separate insole 202. The sandal is customized specifically to insole 202, and the insole user's foot. Sandal 200 includes a midsole 204, an upper 206, and an outsole 208. Upper 206 includes a single strap extending over the top or bridge of the user's foot. Midsole 204 and outsole 208 may be additively manufactured as a unitary structure, and are an example of a custom footwear sole component.

Midsole 204 includes an upper surface 210 formed by a lattice structure 212. Lattice structure 212 is non-uniform, and is optimized according to the biomechanics of the user, as is discussed above. Lattice structure 212 preferably is an assembly of beams extending between nodes, such as a beam 209 extending between nodes 211 and 213. In some examples, the lattice structure may also be designed and/or optimized according to functional properties of insole 202. Upper surface 210 is shaped and contoured to complement and conform to insole 202. More specifically, upper surface 210 of midsole 204 conforms to a lower surface 214 of insole 202, as shown in FIG. 5.

An upper surface 216 of insole 202, opposite lower surface 214, contacts the sole of the user's foot. Midsole 204 may be designed to support insole 202 such that upper surface 216 conforms to the sole of the user's foot.

Figure 6:
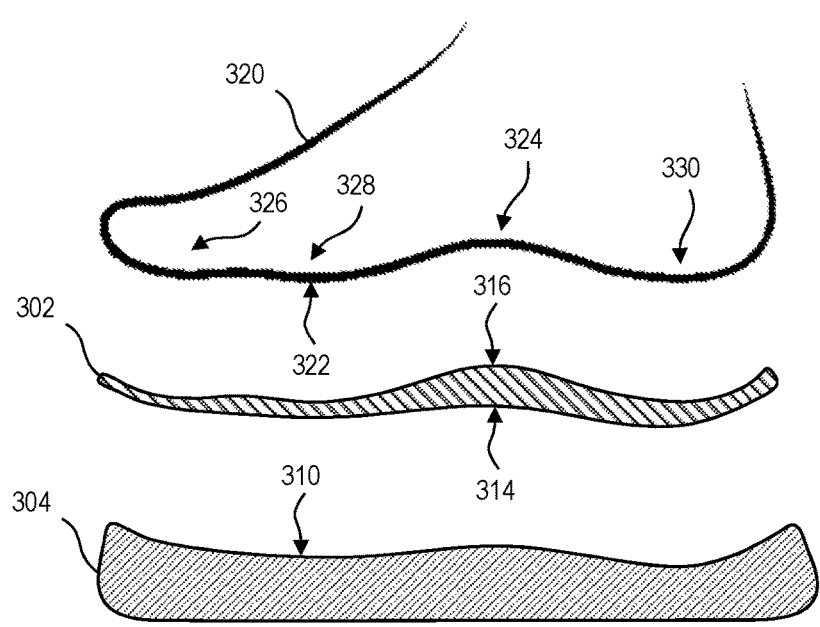
FIG. 6 is a simplified exploded view showing a user foot, an exemplary insole, and an exemplary midsole of a footwear item.
Figure 7:
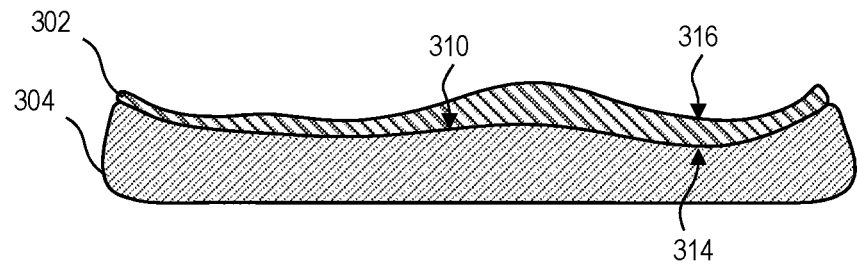
FIG. 7 is a simplified view of the insole and midsole of FIG. 6 with the insole in a position for use on the midsole.
Figure 8:
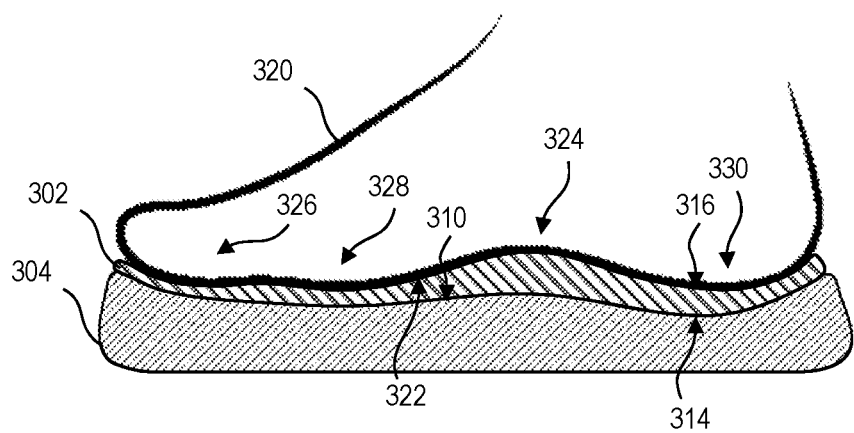
FIG. 8 is a simplified view showing the user foot in place on the insole and midsole as shown in FIG. 7.

FIGS. 6-8 depict an illustrative midsole 304 customized for an insole 302 and a user's foot 320. Midsole 304 may be combined with an outsole and/or an upper to form a custom footwear item.

Insole 302 includes an upper surface 316 and a lower surface 314, each of which have a three-dimensional shape. The upper surface is configured to be worn against the user's foot, as shown in FIG. 8. In the depicted example, upper surface 316 is shaped to conform to a sole 322 of the user's foot and covers the entirety of the sole of the foot. In some examples, insole 302 may be designed such that foot 320 is repositioned by the insole and sole 322 conforms to upper surface 316.

Insole 302 varies in thickness between lower surface 314 and upper surface 316 to provide support at needed areas of the foot, and/or to appropriately position foot 320. Accordingly, upper surface 316 and lower surface 314 of the insole differ in shape. For instance, insole 302 is thickest proximate an arch region 324 of foot 320 to provide greatest support, and thinnest proximate a toe region 326 of the foot where little support is require. At a forefoot region 328 and a heel region 330, the insole has an intermediate thickness for moderate support.

Midsole 304 has an upper surface 310, which is shaped to conform to lower surface 314 of insole 302. The midsole is shaped such that upper surface 310 conforms to lower surface 314 without deformation of midsole 304 or insole 302, as shown in FIG. 7. Upper surface 310 may also be described as complementary to lower surface 314, or matching the lower surface.

Figure 9:
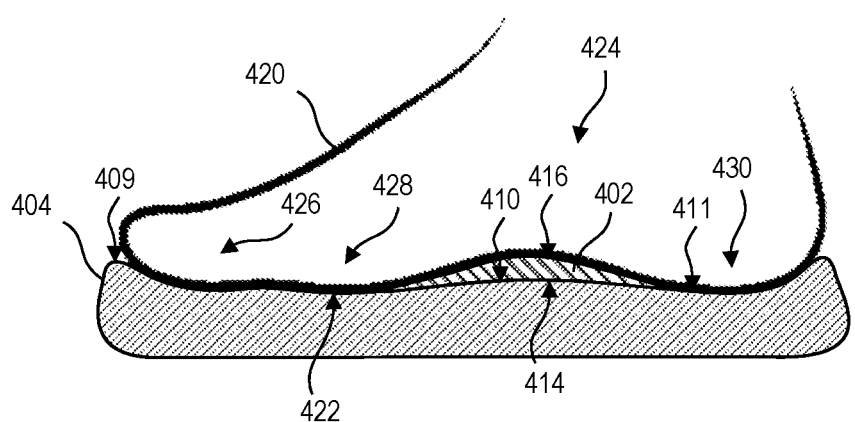
FIG. 9 is a view similar to FIG. 8, but showing another example of an insole in position on a portion of an upper surface of another example of a midsole.
Figure 10:
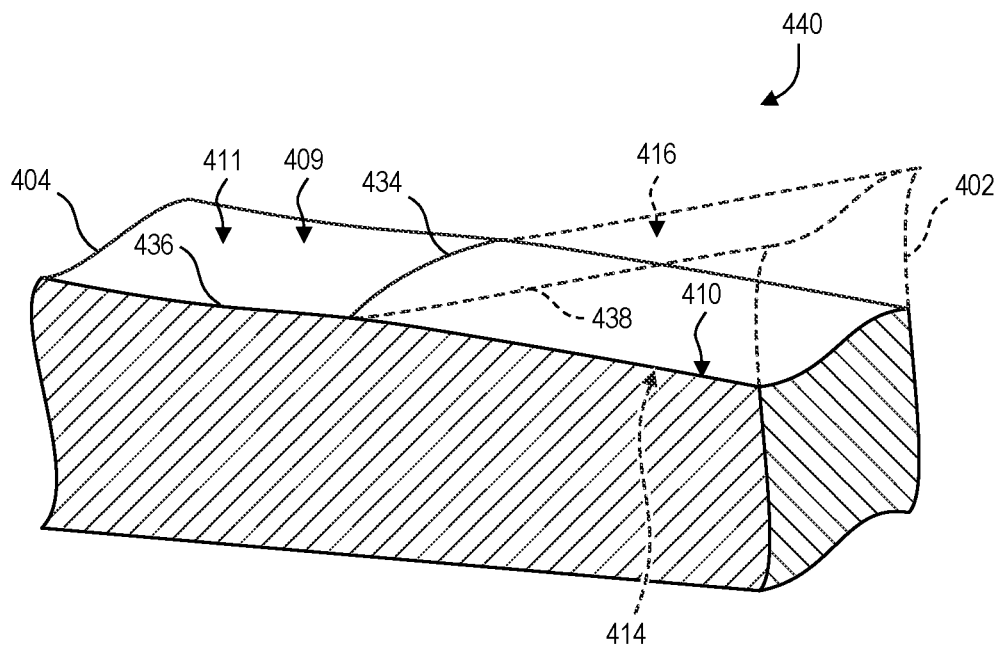
FIG. 10 is a detail view of an edge of the insole of FIG. 9, at the upper surface of the midsole.

FIGS. 9 and 10 depict another illustrative midsole 404, customized for an insole 402 and a user's foot 420. Midsole 404 may be combined with an outsole and/or an upper to form a custom footwear item.

Insole 402 is positioned proximate an arch region 424 of foot 420 to provide targeted support to the arch of the foot. The insole includes an upper surface 416 and a lower surface 414, each of which have a respective three-dimensional shape. The upper surface is configured to be worn against the user's foot, as shown in FIG. 9. In the depicted example, upper surface 416 is shaped to conform to a sole 422 of the user's foot, but covers only a portion of the sole of the foot.

Midsole 404 is shaped to conform to a combination of lower surfaces of insole 402 and sole 422 of the user's foot. Proximate an arch region 424 of foot 420, the midsole contacts insole 402. At toes 426, forefoot 428, and heel 430 of the foot, midsole 404 contacts sole 422 of the foot directly. The midsole includes an upper surface 409 with a first portion 410 conforming to lower surface 414 of insole 402, and a second portion 411 conforming to sole 422 of the user's foot.

FIG. 10 is a detail view of a portion of insole 402 and midsole 404 around forefoot region 428. The insole is shown in dashed lines in position on first upper surface portion 410 of the midsole. The upper surface 409 may be described as forming a junction line 434 where first upper surface portion 410 and second upper surface portion 411 meet. Viewed along surface line 434, the second upper surface portion 411 is adjacent and extends away from upper surface 416 of insole 402.

Also, as viewed along surface line 434, second upper surface portion 411 and upper surface 416 extend transverse to surface line 434, as represented by respective surface section lines 436 and 438. It is seen that section lines 436 and 438 are aligned, that is, substantially in line. Thus, second upper surface portion 411 and upper surface 416 form a combined foot support surface 440 that is relatively smooth adjacent to surface line 434. As an example, second upper surface portion 411 and upper surface 416 are considered aligned when associated surface lines 432 and 434 that are transverse to surface line 434 and in a common plane normal to surface line 434 are within ten degrees of being parallel adjacent to surface line 434.

Figure 11:
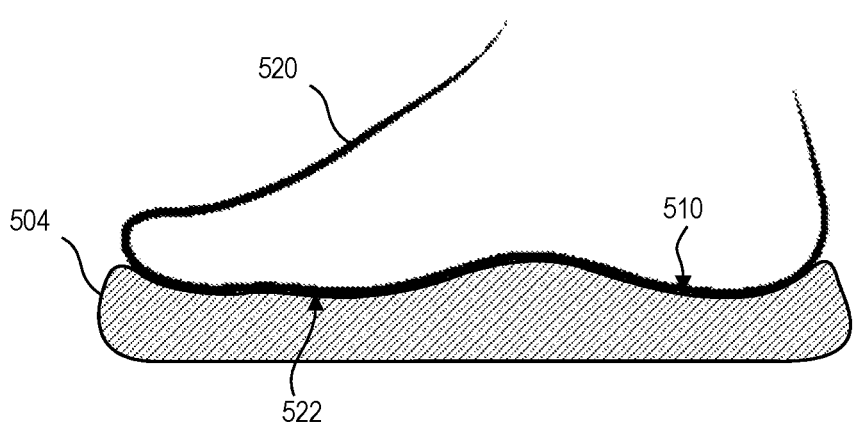
FIG. 11 is a further view showing the user's foot in position on another example of a midsole.

FIG. 11 depicts another illustrative midsole 504, customized to replace an insole for a user's foot 520. Midsole 504 may be combined with an outsole and/or an upper to form a custom footwear item.

Midsole 504 includes an upper surface 510, which is configured to be worn against a sole 522 of the user's foot. In the depicted example, the upper surface is shaped to conform to sole 522 without deformation of the midsole. In some examples, midsole 504 may be designed such that foot 520 is repositioned by the midsole and sole 522 conforms to upper surface 510.

Midsole 504 is configured to support foot 520 in the same manner as the replaced insole. The midsole may comprise an additively manufactured lattice or other customizable material, and may be customized to mimic or re-create the supportive features of the replaced insole. That is, material properties of the midsole may be customized to match material properties of the replaced insole that have been measured or otherwise input into data processing system 22. Upper surface 510 of the midsole may also have three-dimensional surface geometry matching a scanned or otherwise detected three-dimensional surface geometry of an upper surface of the replaced insole.

D. Illustrative Data Processing System

Figure 12:
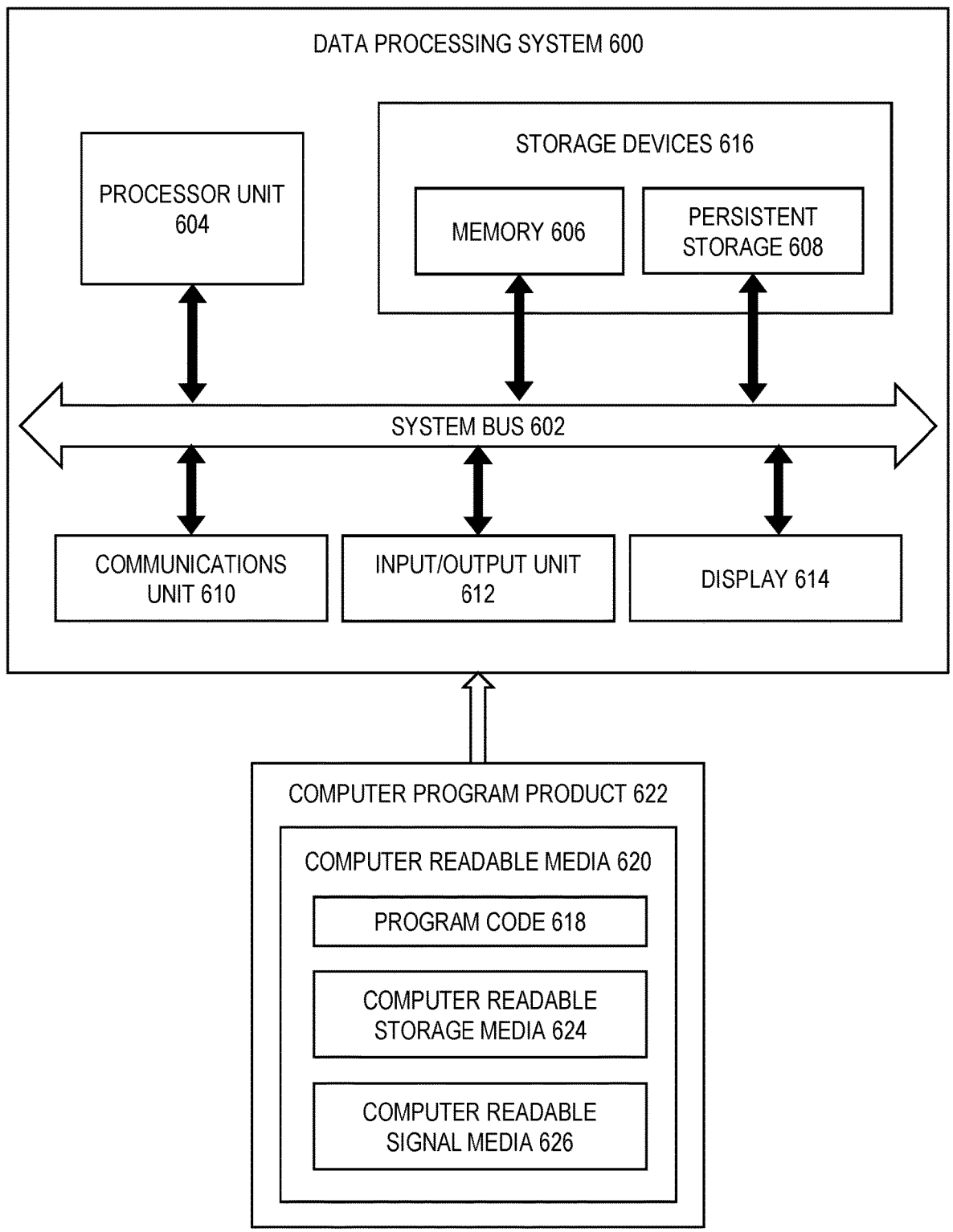
FIG. 12 is a block diagram of an exemplary data processing system usable in the system of FIG. 1.

As shown in FIG. 12, this example describes a data processing system 600 (also referred to as a computer, computing system, and/or computer system) in accordance with aspects of the present disclosure. In this example, data processing system 600 is an illustrative data processing system suitable for implementing aspects of data processing system 22 and/or method 100 of for designing and making custom footwear. More specifically, in some examples, devices that are examples of data processing systems (e.g., laptops, tablets, personal computers) may be used to collect and process data such as 3D scan data or biometric readings, may be used to design custom footwear or footwear components, and/or may be used to direct or control additive manufacture of custom footwear or footwear components.

In this illustrative example, data processing system 600 includes a system bus 602 (also referred to as communications framework). System bus 602 may provide communications between a processor unit 604 (also referred to as a processor or processors), a memory 606, a persistent storage 608, a communications unit 610, an input/output (I/O) unit 612, and/or a display 614.

Processor unit 604 serves to run instructions that may be loaded into memory 606. Processor unit 604 may comprise a number of processors, a multi-processor core, and/or a particular type of processor or processors (e.g., a central processing unit (CPU), graphics processing unit (GPU), etc.), depending on the particular implementation. Further, processor unit 604 may be implemented using a number of heterogeneous processor systems in which a main processor is present with secondary processors on a single chip.

Memory 606 and persistent storage 608 are examples of storage devices 616. A storage device may include any suitable hardware capable of storing information (e.g., digital information), such as data, program code in functional form, and/or other suitable information, either on a temporary basis or a permanent basis, such as data on user database 40, material properties database 44, product design database 46, and remote database 48. Storage devices 616 also may be referred to as computer-readable storage devices or computer-readable media.

Persistent storage 608 may contain one or more components or devices. For example, persistent storage 608 may include one or more devices such as a magnetic disk drive (also referred to as a hard disk drive or HDD), solid state disk (SSD), an optical disk drive such as a compact disk ROM device (CD-ROM), flash memory card, memory stick, and/or the like, or any combination of these. One or more of these devices may be removable and/or portable, e.g., a removable hard drive.

Input/output (I/O) unit 612 allows for input and output of data with other devices that may be connected to data processing system 600 (i.e., input devices and output devices). For example, an input device may include one or more pointing and/or information-input devices such as a keyboard, a mouse, touch screen, microphone, digital camera, image capture device 54, biomechanics capture device 56, and/or the like. These and other input devices may connect to processor unit 604 through system bus 602 via interface port(s) such as a serial port and/or a universal serial bus (USB).

Output devices may use some of the same types of ports, and in some cases the same actual ports, as the input device(s). For example, a USB port may be used to provide input to data processing system 600 and to output information from data processing system 600 to an output device. Some output devices (e.g., monitors, speakers, and printers, among others, such as additive manufacturing device 52) may require special adapters. Display 614 may include any suitable human-machine interface or other mechanism configured to display information to a user, e.g., a CRT, LED, or LCD monitor or screen, etc.

Communications unit 610 refers to any suitable hardware and/or software employed to provide for communications with other data processing systems or devices. While communication unit 610 is shown inside data processing system 600, it may in some examples be at least partially external to data processing system 600. Communications unit 610 may include internal and external technologies, e.g., modems, ISDN adapters, and/or wired and wireless Ethernet cards, hubs, routers, etc. Data processing system 600 may operate in a networked environment, using logical connections to one or more remote computers, such as network 34.

Instructions for the operating system, applications, and/or programs may be located in storage devices 616, which are in communication with processor unit 604 through system bus 602. In these illustrative examples, the instructions are in a functional form in persistent storage 608. These instructions may be loaded into memory 606 for execution by processor unit 604. Processes of one or more examples of the present disclosure may be performed by processor unit 604 using computer-implemented instructions, which may be located in a memory, such as memory 606.

These instructions are referred to as program instructions, program code, computer usable program code, or computer-readable program code executed by a processor in processor unit 604. The program code in the different examples may be embodied on different physical or computer-readable storage media, such as memory 606 or persistent storage 608. Program code 618 may be located in a functional form on computer-readable media 620 that is selectively removable and may be loaded onto or transferred to data processing system 600 for execution by processor unit 604. Program code 618 and computer-readable media 620 form computer program product 622 in these examples. In one example, computer-readable media 620 may comprise computer-readable storage media 624 or computer-readable signal media 626.

The different components illustrated for data processing system 600 are not meant to provide architectural limitations to the manner in which different examples may be implemented. One or more examples of the present disclosure may be implemented in a data processing system that includes fewer components or includes components in addition to and/or in place of those illustrated for computer 600. Other components shown in FIG. 12 can be varied from the examples depicted. Different examples may be implemented using any hardware device or system capable of running program code.

In some examples, processor unit 604 may take the form of a hardware unit having hardware circuits that are specifically manufactured or configured for a particular use, or to produce a particular outcome or progress. This type of hardware may perform operations without needing program code 618 to be loaded into a memory from a storage device to be configured to perform the operations. For example, processor unit 604 may be a circuit system, an application specific integrated circuit (ASIC), a programmable logic device, or some other suitable type of hardware configured (e.g., preconfigured or reconfigured) to perform a number of operations.

Illustrative Combinations and Additional Examples

This section describes additional aspects and features of custom footwear, sole components and methods of manufacturing thereof, presented without limitation as a series of paragraphs, some or all of which may be alphanumerically designated for clarity and efficiency. Each of these paragraphs can be combined with one or more other paragraphs, and/or with disclosure from elsewhere in this application, in any suitable manner. Some of the paragraphs below expressly refer to and further limit other paragraphs, providing without limitation examples of some of the suitable combinations.

A0. A method of making a custom sole component of a footwear item intended for wearing on a foot of a user, comprising:
    detecting a shape of a lower surface of an underfoot component having an upper surface intended for use against a sole of the foot of the user when wearing the footwear item;
    determining a sole-component design defining an upper surface conforming to the detected shape; and
    creating the custom sole component according to the sole-component design.

A1. The method of A0, wherein the step of detecting the shape of the lower surface of the underfoot component is performed with the underfoot component in a use position against the sole of the foot of the user.

A2. The method of A0 or A1, wherein the step of detecting the shape of the lower surface of the underfoot component is performed independent of the foot of the user, and further including detecting a shape of the sole of the foot of the user.

A3. The method of A2, further comprising:
    determining a combination lower surface including the lower surface of the underfoot component and a portion of the sole of the foot of the user extending beyond the lower surface of the underfoot component;
    wherein the determined sole-component design defines the upper surface to conform to the determined combination lower surface.

A4. The method of any of A0-A3, wherein:
    detecting the shape of the lower surface of the underfoot component includes producing three-dimensional geometrical surface data describing an as-worn shape of the lower surface of the underfoot component; and
    determining the sole-component design includes designing the upper surface of the sole component to complement the as-worn shape of the lower surface of the underfoot component according to the produced three-dimensional geometrical surface data.

A5. The method of A4, wherein producing three-dimensional geometrical surface data includes scanning the foot of the user and scanning the underfoot component while the underfoot component is positioned against the sole of the foot of the user; and designing the upper surface of the sole component includes combining data from the scan of the foot and the scan of the underfoot component.

A6. The method of A5, wherein, combining data from the scan of the foot and the scan of the underfoot component includes selecting for each of a set of dimensions, the larger of (a) the dimension of the underfoot component and (b) the dimension of the foot.

A7. The method of A6, wherein the set of dimensions includes heel width, ball width, and heel-to-toe length.

A8. The method of any of A4-A7, wherein the upper surface of the designed sole component complements a shape of a portion of a sole of the foot of the user, the portion of the sole not being covered by the underfoot component when the underfoot component is worn on the foot of the user.

A9. The method of any of A4-A8, wherein producing three-dimensional geometrical surface data includes scanning a combination of the foot of the user and the underfoot component while the underfoot component is worn by the user.

A10. The method of any of A4-A9, further including measuring a distribution of underfoot forces of the foot of the user, and wherein designing the sole component includes configuring a lattice structure of the sole component according to the measured distribution of underfoot forces and an area of the upper surface of the sole component.

A11. The method of A10, wherein the sole component is designed using Computer Aided Design (CAD) software, and creating the designed sole component includes converting a produced design file to a format suitable for an additive manufacturing apparatus.

B0. A custom footwear item comprising:
an underfoot component having an upper surface configured to be worn against a sole of a foot of a user and a lower surface; and
a sole component having a first upper surface portion conforming to the lower surface of the underfoot component and a second upper surface portion that extends beyond the upper surface of the underfoot component, wherein when the underfoot component is positioned on the first upper surface portion of the sole component, the second upper surface portion adjacent to the upper surface of the underfoot component is aligned with the upper surface of the underfoot component when viewed along a surface line formed where the first upper surface portion meets the second upper surface portion.

B1. The custom footwear item of B0, wherein the underfoot component is separable from the sole component.

B2. The custom footwear item of B0 or B1, wherein the sole component includes an additively manufactured lattice structure.

B3. The custom footwear item of any of B0-B2, wherein second upper surface portion of the sole component conforms to the foot of the user.

C0. A system for making a custom sole component of a footwear item intended for wearing on a foot of a user, comprising:
a sensor assembly configured to detect a shape of a lower surface of an underfoot component having an upper surface intended for use against a sole of the foot of the user when wearing the footwear item;
one or more than one storage device configured to store data relating to the lower surface of the underfoot component;
a processor coupled to the sensor assembly and the storage device and configured to determine a sole-component design defining an upper surface conforming to the detected shape; and
a manufacturing apparatus configured to create the custom sole component having the sole-component design.

C1. The system of C0, wherein the sensor assembly is configured to detect the shape of the lower surface of the underfoot component with the underfoot component in a use position against the sole of the foot of the user.

C2. The system of C0 or C1, wherein the sensor assembly is configured to detect the shape of the lower surface of the underfoot component independent of the foot of the user, and further configured to detect a shape of the sole of the foot of the user.

C3. The system of C2, wherein the processor is configured to determine a combination lower surface including the lower surface of the underfoot component and a portion of the sole of the foot of the user extending beyond the lower surface of the underfoot component, and determine the sole-component design to define the upper surface to conform to the determined combination lower surface.

C4. The system of any of C0-C3, wherein the sensor assembly is configured to produce three-dimensional geometrical surface data describing an as-worn shape of the lower surface of the underfoot component; and the processor is configured to design the upper surface of the sole component to complement the as-worn shape of the lower surface of the underfoot component according to the produced three-dimensional geometrical surface data.

C5. The system of C4, wherein the sensor assembly is configured to scan the foot of the user and scan the underfoot component while the underfoot component is positioned against the sole of the foot of the user; and the processor is configured to combine data from the scan of the foot and the scan of the underfoot component and design the upper surface of the sole component to conform to the combined data from the scan of the foot and the scan of the underfoot component.

C6. The system of C5, wherein the processor is configured to combine data from the scan of the foot and the scan of the underfoot component by, at least in part, selecting for each of a set of dimensions, the larger of (a) the dimension of the underfoot component and (b) the dimension of the foot.

C7. The system of C6, wherein the set of dimensions includes heel width, ball width, and heel-to-toe length.

C8. The system of any of C4-C7, wherein the processor is configured to design the upper surface of the designed sole component to complement a shape of a portion of a sole of the foot of the user that is not covered by the underfoot component when the underfoot component is worn on the foot of the user.

C9. The system of any of C4-C8, wherein the sensor assembly is configured to scan a combination of the foot of the user and the underfoot component while the underfoot component is worn by the user.

C10. The system of any of C4-C9, wherein the sensor assembly is configured to measure a distribution of underfoot force of the foot of the user, and the processor is configured to design the sole component by at least in part configuring a lattice structure of the sole component according to the measured distribution of underfoot force over an area of the upper surface of the sole component.

C11. The system of C10, wherein the processor is configured to design the sole component using Computer Aided Design (CAD) software, and the manufacturing apparatus is an additive manufacturing apparatus configured to convert the design produced by the processor to a format suitable for additive manufacturing.

Advantages, Features, and Benefits

The different examples of the custom footwear, custom sole components, and methods of manufacture described herein provide several advantages over known uses of user underfoot components such as insoles and orthotics with footwear.

Typically, a user with a custom underfoot component such as a prescribed orthotic must place the underfoot component in a standard shoe. To accommodate the underfoot component, the user may need to remove an insole of the shoe, trim the underfoot component, or even tear out a portion of the shoe. The standard shoe may only conform to the underfoot component under pressure of the user's foot, if at all. That is, the shoe may deform to match the lower surface of the underfoot component and/or gaps may be left between some portions of the underfoot component and the shoe. Deforming to match the underfoot component may reduce the efficacy of the underfoot component, and even adversely affect the support of the user.

Illustrative examples of custom footwear and sole components described herein allow the footwear to conform to a user's underfoot component by design, without damage or deformation.

Additionally, and among other benefits, illustrative examples described herein allow footwear to accommodate an underfoot component, without trimming or gapping.

Additionally, and among other benefits, illustrative examples described herein eliminate space between a user's foot, the user's underfoot component, and an item of footwear. This may reduce the risk of adverse effects such as blisters, and facilitate full orthotic support by the underfoot component.

Additionally, and among other benefits, illustrative examples described herein allow design of a midsole configured to support the specific biomechanics of a user's foot in combination with an underfoot component.

Additionally, and among other benefits, illustrative examples described herein allow design of a midsole configured to replace a user's underfoot component.

No known system or device can perform these functions, particularly with the range of geometrically and dynamically customization possible with a custom lattice structure. Thus, the illustrative examples described herein are particularly useful for additively manufacture footwear components. However, not all examples described herein provide the same advantages or the same degree of advantage.

CONCLUSION

The disclosure set forth above may encompass multiple distinct examples with independent utility. Although each of these has been disclosed in its preferred form(s), the specific examples thereof as disclosed and illustrated herein are not to be considered in a limiting sense, because numerous variations are possible. To the extent that section headings are used within this disclosure, such headings are for organizational purposes only. The subject matter of the disclosure includes all novel and nonobvious combinations and subcombinations of the various elements, features, functions, and/or properties disclosed herein. The following claims particularly point out certain combinations and subcombinations regarded as novel and nonobvious. Other combinations and subcombinations of features, functions, elements, and/or properties may be claimed in applications claiming priority from this or a related application. Such claims, whether broader, narrower, equal, or different in scope to the original claims, also are regarded as included within the subject matter of the present disclosure.

What is claimed is:

1. A system for making a custom sole component of a footwear item intended for wearing on a foot of a user, comprising:
   a sensor assembly configured to detect a shape of a lower surface of an underfoot component having an upper surface intended for use against a sole of the foot of the user when wearing the footwear item;
   one or more than one storage device configured to store data relating to the lower surface of the underfoot component;
   a processor coupled to the sensor assembly and the storage device and configured to determine a sole-component design defining an upper surface conforming to the detected shape; and
   a manufacturing apparatus configured to create the custom sole component having the sole-component design.

2. The system of claim 1, wherein the sensor assembly is configured to detect the shape of the lower surface of the underfoot component with the underfoot component in a use position against the sole of the foot of the user.

3. The system of claim 1, wherein the sensor assembly is configured to detect the shape of the lower surface of the underfoot component independent of the foot of the user, and further configured to detect a shape of the sole of the foot of the user.

4. The system of claim 3, wherein the processor is configured to determine a combination lower surface including the lower surface of the underfoot component and a portion of the sole of the foot of the user extending beyond the lower surface of the underfoot component, and determine the sole-component design to define the upper surface to conform to the determined combination lower surface.

5. The system of claim 4, wherein the sensor assembly is configured to produce three-dimensional geometrical surface data describing an as-worn shape of the lower surface of the underfoot component; and the processor is configured to design the upper surface of the sole component to complement the as-worn shape of the lower surface of the underfoot component according to the produced three-dimensional geometrical surface data.

6. The system of claim 1, wherein the sensor assembly is configured to produce three-dimensional geometrical surface data describing an as-worn shape of the lower surface of the underfoot component; and the processor is configured to design the upper surface of the sole component to complement the as-worn shape of the lower surface of the underfoot component according to the produced three-dimensional geometrical surface data.

7. The system of claim 6, wherein the sensor assembly is configured to scan the foot of the user and scan the underfoot component while the underfoot component is positioned against the sole of the foot of the user; and the processor is configured to combine data from the scan of the foot and the scan of the underfoot component and design the upper surface of the sole component to conform to the combined data from the scan of the foot and the scan of the underfoot component.

8. The system of claim 7, wherein the processor is configured to combine data from the scan of the foot and the scan of the underfoot component by, at least in part, selecting for each of a set of dimensions, the larger of (a) the dimension of the underfoot component and (b) the dimension of the foot.

9. The system of claim 8, wherein the set of dimensions includes heel width, ball width, and heel-to-toe length.

10. The system of claim 9, wherein the processor is configured to design the upper surface of the designed sole component to complement a shape of a portion of a sole of the foot of the user that is not covered by the underfoot component when the underfoot component is worn on the foot of the user.

11. The system of claim 6, wherein the processor is configured to design the upper surface of the designed sole component to complement a shape of a portion of a sole of the foot of the user that is not covered by the underfoot component when the underfoot component is worn on the foot of the user.

12. The system of claim 11, wherein the sensor assembly is configured to scan a combination of the foot of the user and the underfoot component while the underfoot component is worn by the user.

13. The system of claim 6, wherein the sensor assembly is configured to scan a combination of the foot of the user and the underfoot component while the underfoot component is worn by the user.

14. The system of claim 6, wherein the sensor assembly is configured to measure a distribution of underfoot force of the foot of the user, and the processor is configured to design the sole component by at least in part configuring a lattice structure of the sole component according to the measured distribution of underfoot force over an area of the upper surface of the sole component.

15. The system of claim 14, wherein the processor is configured to design the sole component using Computer Aided Design (CAD) software, and the manufacturing apparatus is an additive manufacturing apparatus configured to convert the design produced by the processor to a format suitable for additive manufacturing.

* * * * *